United States Patent
Sung et al.

(10) Patent No.: US 6,245,685 B1
(45) Date of Patent: Jun. 12, 2001

(54) METHOD FOR FORMING A SQUARE OXIDE STRUCTURE OR A SQUARE FLOATING GATE STRUCTURE WITHOUT ROUNDING EFFECT

(75) Inventors: Hung-Cheng Sung, Hsin-Chu; Di-Son Kuo, Hsinchu; Chia-Ta Hsieh, Tainan, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/387,441

(22) Filed: Sep. 1, 1999

(51) Int. Cl.$^7$ .................................................. H01L 21/00
(52) U.S. Cl. .................... 438/719; 438/723; 438/733; 438/734; 438/738
(58) Field of Search ................... 438/710, 712, 438/717, 719, 723, 724, 733, 734, 737, 738, 743, 744, 257; 216/67, 79

(56) References Cited

U.S. PATENT DOCUMENTS

| | | | |
|---|---|---|---|
| 5,364,806 | 11/1994 | Ma et al. | 437/43 |
| 5,780,341 | 7/1998 | Ogura | 438/259 |
| 5,811,853 | 9/1998 | Wang | 257/316 |
| 5,858,840 | 1/1999 | Hsieh et al. | 438/266 |
| 5,879,992 | 3/1999 | Hsieh et al. | 438/264 |
| 5,939,741 | * 8/1999 | Clampitt et al. | 438/719 X |

\* cited by examiner

*Primary Examiner*—William Powell
(74) *Attorney, Agent, or Firm*—George O. Saile; Stephen B. Ackerman; William J. Stoffel

(57) ABSTRACT

A method for forming a square oxide structure or a square floating gate without a rounding effect at its corners. A first dielectric layer is formed on a pad layer for a square oxide structure or a polysilicon layer overlying a gate oxide layer for a floating gate, and a second dielectric layer is formed on the first dielectric layer. The second dielectric layer is patterned to form parallel openings in a first direction using a first photosensitive mask. A second photosensitive mask, having a plurality of parallel openings in a second direction perpendicular to the first direction is formed over the second dielectric layer and the first dielectric layer. The first dielectric layer is etched through square openings where the openings in the second photosensitive mask and the openings in the second dielectric layer intersect, thereby forming square openings in the first dielectric layer. The second photosensitive mask and the second dielectric layer are removed. The square oxide structure is completed by etching a trench in the semiconductor structure and forming an STI or LOCOS. The square floating gate is completed by growing polysilicon oxide structures in the square openings in the first dielectric layer and removing the first dielectric layer to form a pattern of openings therebetween, and etching the polysilicon layer through the pattern of openings between the polysilicon oxide structures forming square floating gate polysilicon regions under the polysilicon oxide hard masks.

14 Claims, 6 Drawing Sheets

METHOD FOR FORMING A SQUARE OXIDE STRUCTURE OR A SQUARE FLOATING GATE STRUCTURE WITHOUT ROUNDING EFFECT

BACKGROUND OF THE INVENTION

1) Field of the Invention

This invention relates generally to fabrication of a semiconductor device and more particularly to a method for forming a square oxide structure or a square floating gate structure without a rounding effect at the corners of the square oxide structure or the square floating gate structure.

2) Description of the Prior Art

The use of a silicon nitride layer as an oxidation mask is well known. To form square structures, such as oxide isolation structures or floating gates in a split cell memory, a photosensitive mask is formed with square openings, and the silicon nitride layer is etched through these openings.

However, due to limitations of the photolithography process, the corners of square openings in the photosensitive mask become rounded. This rounding of the corners of a square opening in a photosensitive mask is known as a rounding effect. As device dimensions continue to shrink, this rounding effect at the corners of square structures can have a detrimental effect on device performance. This detrimental effect can be worse when mis-alignment between photolithography masks occurs.

Another problem which occurs as packing density increases, is that the gap between floating gates in a split cell memory device is limited by the photolithography process. After a polysilicon layer is formed, openings (or gaps) are etched to define and separate floating gates. The width of the opening in the photosensitive or silicon nitride etch mask is limited by parameters of the photolithography process such as wavelength of the energy source, resolution, and aspect ratio.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,879,992 (Hsieh et al.) shows a flash split gate memory using a poly oxide hard mask to etch an underlying floating gate in an underlying polysilicon layer.

U.S. Pat. No. 5,858,940 (Hsieh et al.) discloses a flash cell split gate memory using a poly oxide hard mask with a sharp tip for etching a floating gate in an underlying polysilicon layer.

U.S. Pat. No. 5,780,341 (Ogura) shows a method for forming an EPROM having an STI.

U.S. Pat. Nos. 5,364,806 (Ma et al.) and 5,811,853 (Wang) disclose other methods for forming flash split gate memories.

SUMMARY OF THE INVENTION

It is an object of the present invention to provide a method for forming a square oxide structure without a rounding effect at its corners.

It is another object of the present invention to provide a method for forming a square floating gate in a split-gate cell without a rounding effect at its corners.

It is yet another object of the present invention to provide a method for forming square floating gates in a split-gate cell with a reduced gap width therebetween.

To accomplish the above objectives, the present invention provides a method for forming a square oxide structure or a square floating gate without a rounding effect at its corners. The key to the invention is the formation of a second dielectric layer and a photosensitive mask having openings perpendicular to each other.

The process begins by providing a semiconductor structure having a pad layer thereon for a square oxide structure or a semiconductor structure having a gate oxide layer and a polysilicon layer successively formed thereover for a floating gate. A first dielectric layer is formed on the pad layer or the polysilicon layer, and a Second dielectric layer is formed on the first dielectric layer. A first photosensitive mask is formed, the Second dielectric layer is patterned to form parallel openings in a first direction, and the first photosensitive mask is removed. A second photosensitive mask, having a plurality of parallel openings in a second direction perpendicular to the first direction is formed over the Second dielectric layer and the first dielectric layer. The first dielectric layer is etched through square openings where the openings in the second photosensitive mask and the openings in the Second dielectric layer intersect, thereby forming square openings in the first dielectric layer. The second photosensitive mask and the TEOS oxide are removed. The square oxide structure is completed by etching a trench in the semiconductor structure and forming an STI or LOCOS. The square floating gate is completed by growing polysilicon oxide structures in the square openings in the first dielectric layer to form a plurality of square polysilicon oxide hard masks with a pattern of openings therebetween, and etching the polysilicon layer through the pattern of openings between the polysilicon oxide hard masks forming square floating gate polysilicon regions under the polysilicon oxide hard masks.

The present invention provides considerable improvement over the prior art. The key advantage of the present invention is that the two separate, perpendicular masks used to form a square opening reduce the rounding effect that occurs due to the photolithography process. The present invention provides square structures without rounded corners, thereby inproving device performance, especially when mismatch occurs.

Also, because the polyoxide hard mask formed in accordance with the present invention grows in width by the length of the bird's beaks which form during oxidation, the gap can be reduced by two times the length of the birds beak.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A, 2A & 3A are sequential top views. FIGS. 1B, 2B and 3B are sequential sectional views taken at cross-section 1B—1B of FIG. 1A, 2B—2B of FIG. 2A, and 3B—3B of FIG. 3A respectively. FIG. 2C is a sectional view taken at cross-section 2C—2C of FIG. 2A.

FIG. 4 illustrates a top view following polysilicon oxidation. FIGS. 5, 6 & 7 illustrate sequential sectional views taken at cross-section 5—5 of FIG. 4.

DETAILED DESCRIPTION OF THE INVENTION

The present invention will be described in detail with reference to the accompanying drawings. The present invention provides a method for forming a square floating gate in a split-gate cell memory device or a square oxide structure without a rounding effect at the corners of the oxide structure or floating gate.

First Preferred Embodiment of the Invention—FIGS. 1A, 1B, 2A, 2B, 2C, 3A & 3B

Figure 1A:
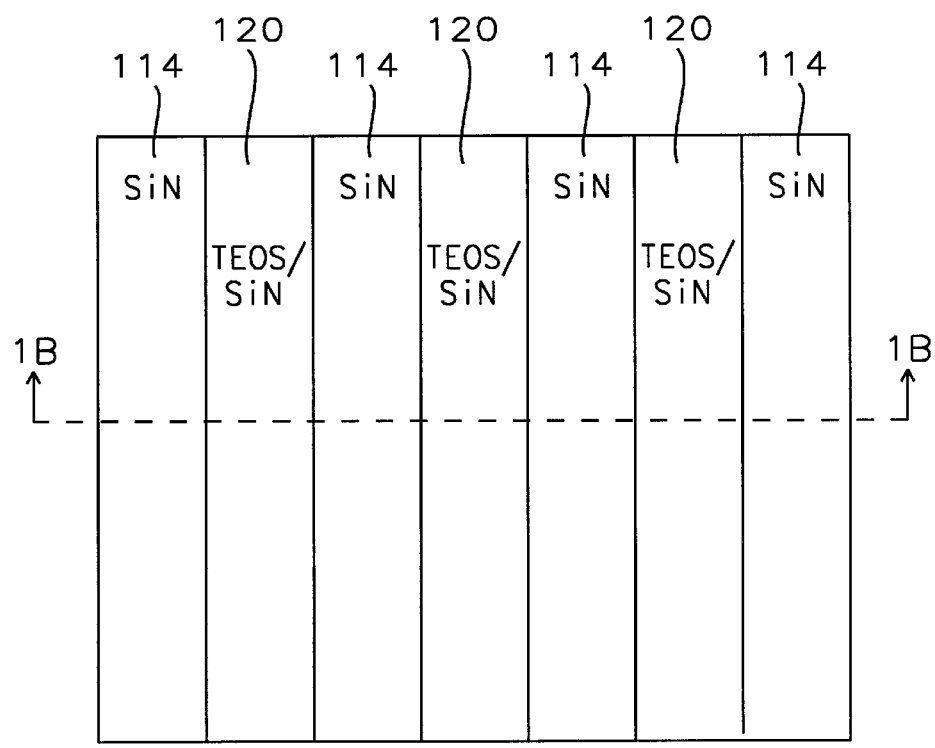
FIGS. 1A, 1B, 2A, 2B, 2C, 3A & 3B illustrate a process for forming a square oxide structure without a rounding effect at its corners according to the inventors' current process.
Figure 1B:
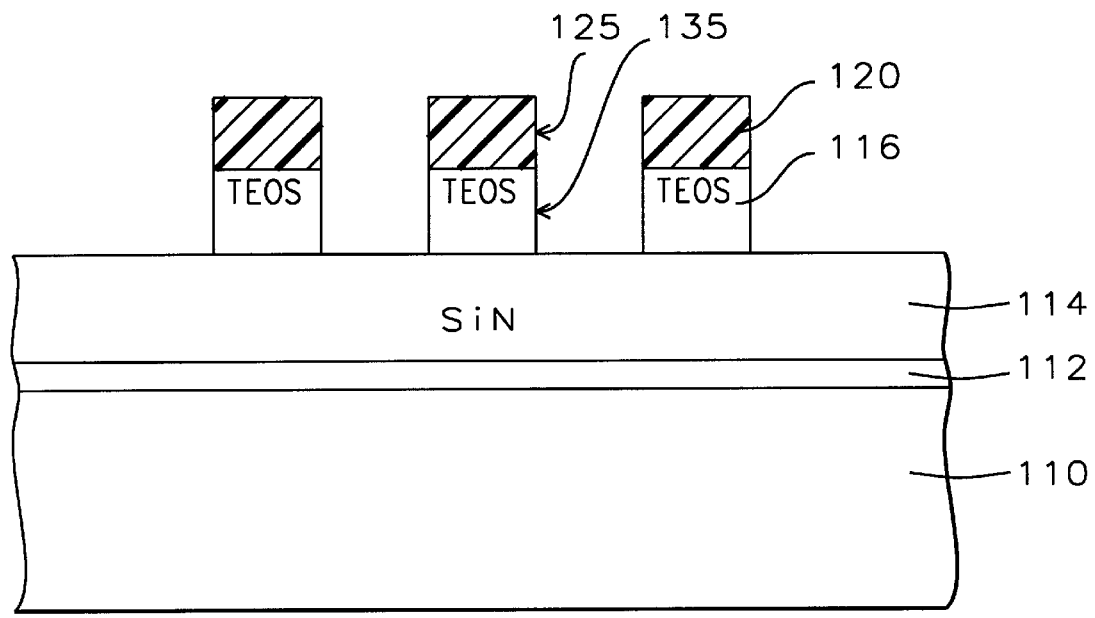

Referring to FIGS. 1A and 1B, the first preferred embodiment of the present invention begins by providing a semiconductor structure (110). Semiconductor structure is to be understood to comprise a substrate such as a silicon wafer or a silicon on insulator substrate. Semiconductor structure is to be understood to possibly further comprise one or more conductive layers (e.g. polysilicon, metal, etc) and/or dielectric layers (e.g. inter poly oxide layer, intermetal dielectric layer, etc) and active and/or passive devices formed in or over the substrate. In the first preferred embodiment, the semiconductor structure (110) preferably comprises a monocrystalline silicon substrate.

A pad layer (112) is formed on the semiconductor structure (110). The pad layer (112) is preferably thermally grown to a thickness of between about 100 Angstroms and 200 Angstroms at a temperature of between about 850° C. and 950° C.

A first dielectric layer (114) is formed on the pad layer (112). The first dielectric layer (112) is preferably composed of silicon nitride having a thickness of between about 1500 Angstroms and 2000 Angstroms, and is preferably formed using a chemical vapor vapor deposition process as is known in the art.

A Second dielectric layer (116) is formed on the first dielectric layer (114). The Second dielectric layer (116) preferably has a thickness of between about 1000 Angstroms and 2000 Angstroms, and is formed by pyrolyzing tetraethoxylsilane (TEOS) in a chemical vapor depositon process as is known in the art.

A first photosensitive mask (120) is formed on the Second dielectric layer (116) by depositing a layer of photoresist and using a photolithography and etch process as is known in the art. The first photosensitive mask (120) has a plurality of parallel openings (125) in a first direction.

The Second dielectric layer (116) is etched through the openings (125) in the first photosensitive mask (120), thereby forming openings (135) in the Second dielectric layer (116) in the first direction. The Second dielectric layer (116) can be etched using a CHF$_3$/CF$_4$ chemistry in a plasma enhanced chemical vapor deposition process. The openings (135) in the Second dielectric layer (116) are in the same direction, have the same width, and have the same spacing as the openings (125) in the first photosensitive mask (120). After the Second dielectric layer (116) is etched, the first photosensitive mask is removed using an ashing process in oxygen as is known in the art.

Figure 2A:
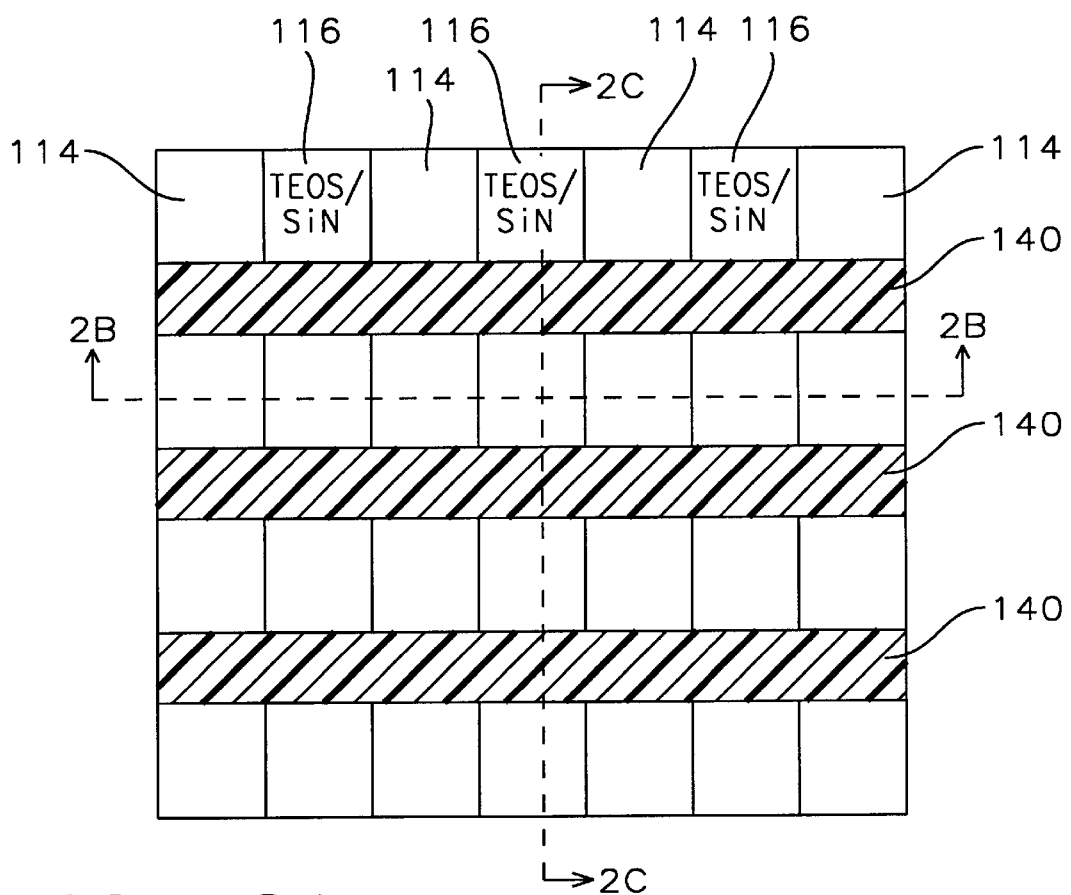
Figure 2B:
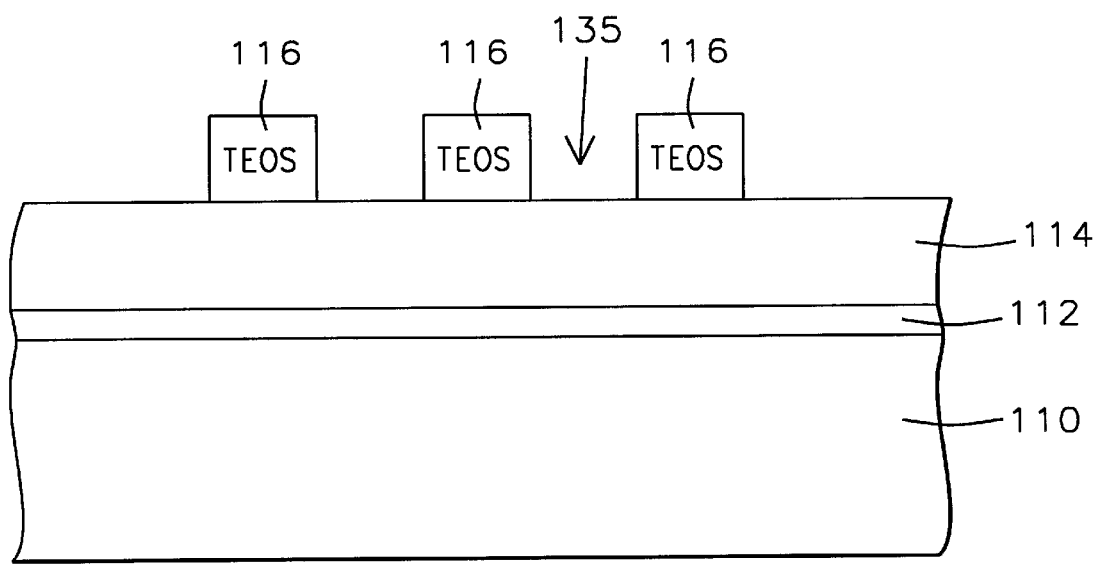
Figure 2C:
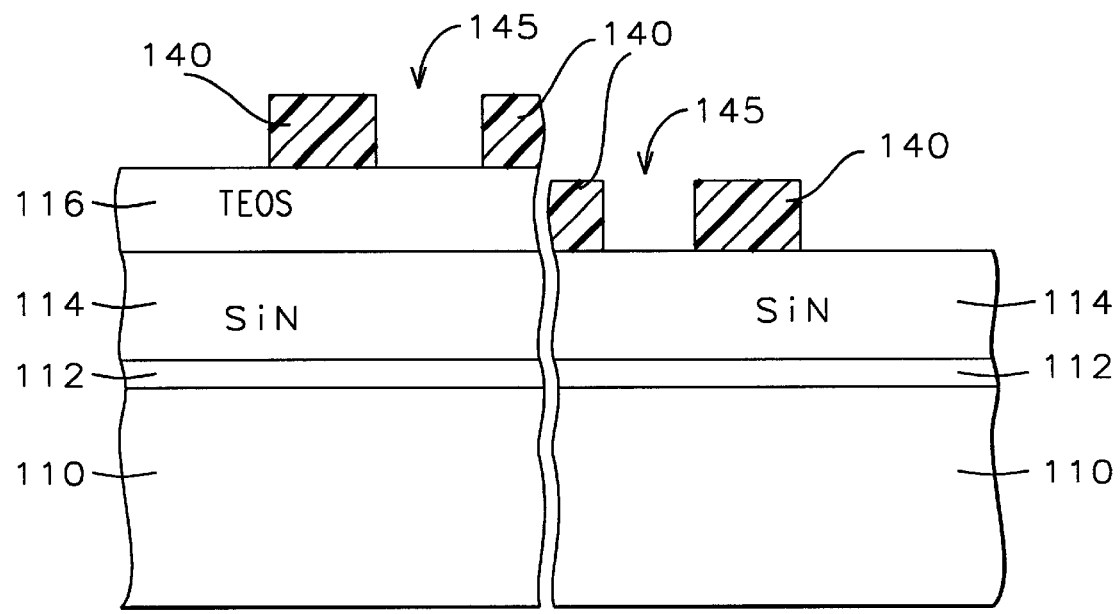

Referring to FIGS. 2A, 2B, and 2C, a second photosensitive mask (140) is formed over the Second dielectric layer (116) and the first dielectric layer (114) by depositing a layer of photoresist and using a photolithography and etch process as is known in the art. The second photosensitive mask (140) has a plurality of parallel openings (145) in a second direction perpendicular to the first direction, thereby forming square openings where the openings (145) in the second photosensitive mask (140) intersect the openings (135) in the TEOS oxider layer (116).

The first dielectric layer (114) is etched through the square openings where the openings (135) in the second photosensitive mask (140) and the openings (135) in the Second dielectric layer (116) intersect; thereby forming square openings in the first dielectric layer (114). The first dielectric layer (114) can be etched using process known in the art, such as a reactive ion etch process with a CHF$_3$/O$_2$, CH$_2$F$_2$, or CH$_3$F chemistry. After the first dielectric layer (114) is etched, the second photosensitive mask (140) is removed using an ashing process in oxygen as is known in the art. Then, the remaining partions of the Second dielectric layer (116) are removed. The remaining portions of the Second dielectric layer (116) are preferably removed using a buffered oxide etch as is known in the art. It should be noted that a buffered oxide etch will also remove exposed areas of the pad layer (112).

Figure 3A:
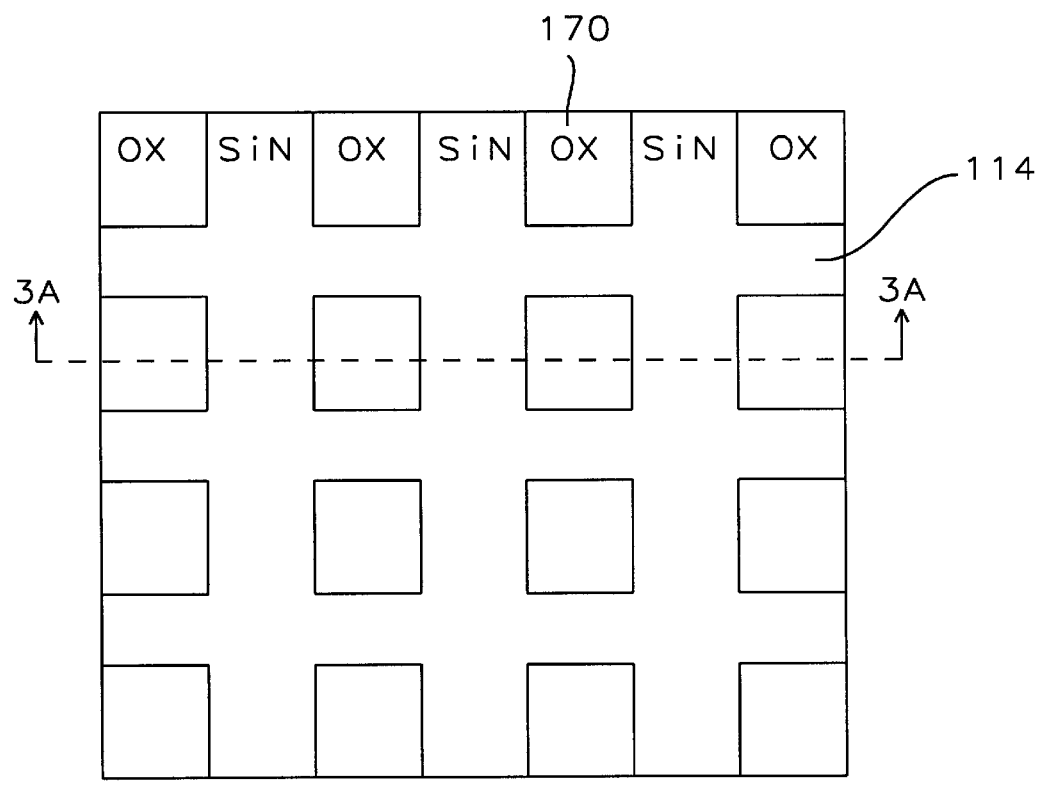
Figure 3B:
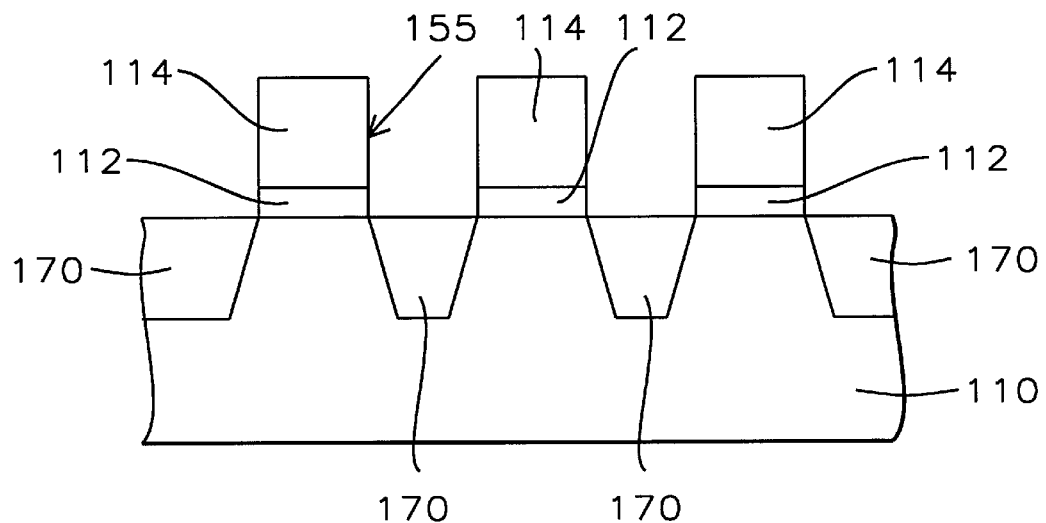
Figure 4:
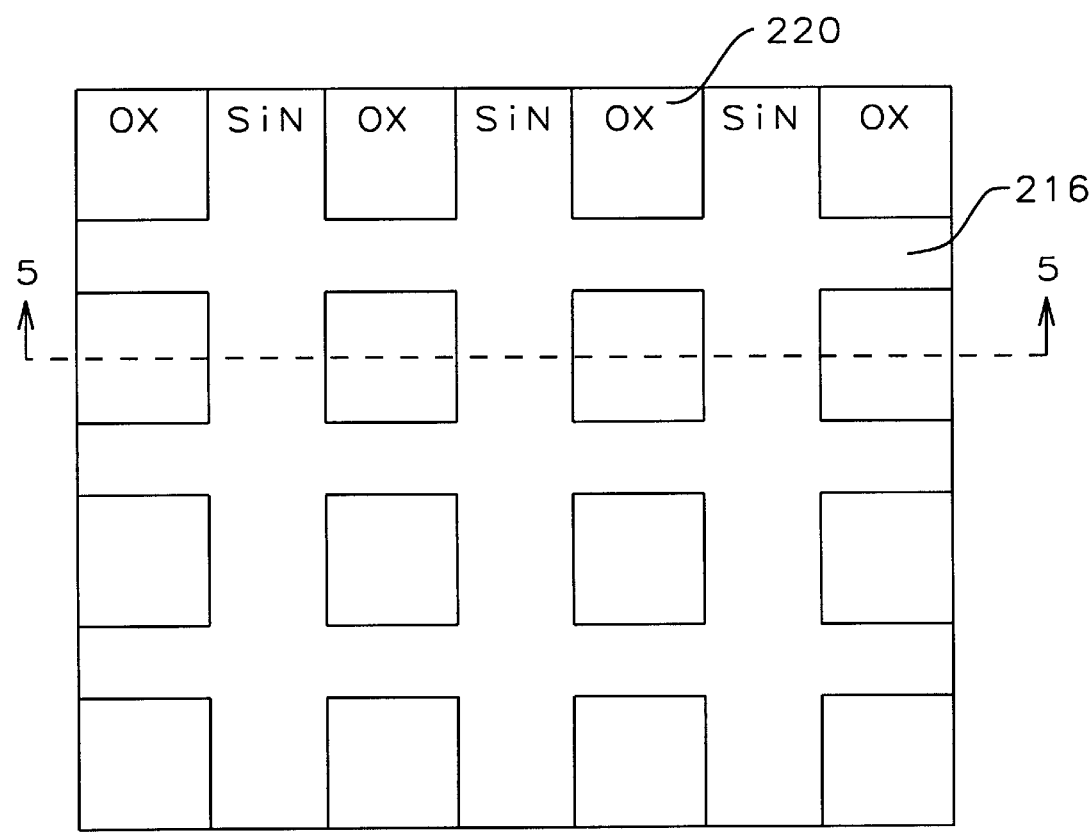
FIGS. 4, 5, 6 & 7 illustrate a process for forming square floating gates without a rounding effect at their corners for a split gate memory device according to the present invention.

Referring to FIGS. 3A & 3B, square trenches (not shown) are etched into the semiconductor structure (110) through the square openings (155) in the first dielectric layer (114). The square trenches in the semiconductor structure (110) can be etched using a method known in the art, such as a plasma etch with a CF$_3$Br-chemistry. The square trenches in the semiconductor structure (110) are preferably etched to a depth of between about 3000 Angstroms and 4000 Angstroms. Square oxide structures (170) are formed in the square trenches in the semiconductor structure (110) by depositing a chemical vapor deposition (CVD) second dielectric layer (not shown) over the semiconductor structure (110) and the first dielectric layer (114) and etching back the CVD second dielectric layer (not shown).

Alternatively, square oxide structures (170) can be thermally grown in the square openings (155) in the first dielectric layer (114) using a LOCOS process as is known in the art.

The key advantage of the present invention is that the square oxide structure does not suffer from a rounding effect at its corners due to the novel method for forming a square opening in the first dielectric layer according to the invention.

Second Preferred Embodiment

Figure 5:
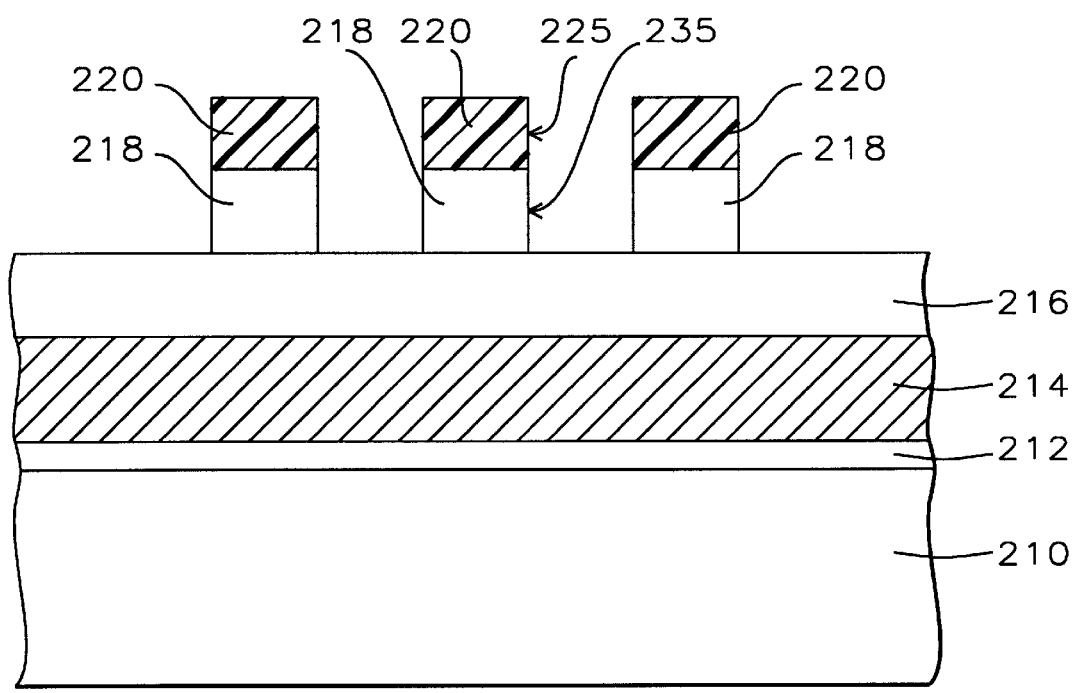

Referring to FIG. 5, the second preferred embodiment of the present invention begins by providing a semiconductor structure (210). Semiconductor structure is to be understood to comprise a substrate such as a silicon wafer or a silicon on insulator substrate. Semiconductor structure is to be understood to possibly further comprise one or more conductive layers (e.g. polysilicon, metal, etc) and/or dielectric layers (e.g. inter poly oxide layer, intermetal dielectric layer, etc) and active and/or passive devices formed in or over the substrate. In the second preferred embodiment, the semiconductor structure (210) preferably comprises a substrate composed of monocrystalline silicon.

A gate oxide layer (212) is formed on the semiconductor structure (110). The gate oxide layer (212) is preferably thermally grown to a thickness of between about 80 Angstroms and 100 Angstroms at a temperature of between about 800° C. and 900° C.

A polysilicon layer (214) is formed on the gate oxide layer (212). The polysilicon layer (214) is preferably formed by pyrolysis of silane at a pressure of between about 200 mTorr and 1000 mTorr and at a temperature of between about 540° C. and 630° C. The polysilicon layer preferably has a thickness of between about 1000 Angstroms and 1500 Angstroms.

A first dielectric layer (216) is formed on the polysilicon layer (214). The first dielectric layer (216) preferably has a thickness of between about 1500 Angstroms and 2000 Angstroms, and is preferably formed using a chemical vapor deposition process as is known in the art.

A Second dielectric layer (218) is formed on the first dielectric layer (216). The Second dielectric layer (218) preferably has a thickness of between about 1000 Angstroms and 2000 Angstroms, and is formed by pyrolyzing tetra-ethoxylsilane (TEOS) in a chemical vapor depositon process as is known in the art.

A first photosensitive mask (220) is formed on the Second dielectric layer (218) by depositing a layer of photoresist and using a photolithography and etch process as is known in the art. The first photosensitive mask (220) has a plurality of parallel openings (225) in a first direction.

The Second dielectric layer (218) is etched through the openings (225) in the first photosensitive mask (220), thereby forming openings (235) in the Second dielectric layer (218) in the first direction. The Second dielectric layer (218) can be etched using a $CHF_3/CF_4$ chemistry in a plasma enhanced chemical vapor deposition process. The openings (235) in the Second dielectric layer (218) are in the same direction, have the same width, and have the same spacing as the openings (225) in the first photosensitive mask (220). After the Second dielectric layer (218) is etched, the first photosensitive mask (220) is removed using an ashing process in oxygen as is known in the art.

As in the first embodiment, a second photosensitive mask (not shown) is formed over the Second dielectric layer (218) and the first dielectric layer (216) by depositing a layer of photoresist and using a photolithography and etch process as is known in the art. The second photosensitive mask (not shown) has a plurality of parallel openings (not shown) in a second direction perpendicular to the first direction, thereby forming square openings where the openings (not shown) in the second photosensitive mask (not shown) intersect the openings (235) in the TEOS oxider layer (218). The second photosensitive mask preferably has a thickness of between about 7000 Angstroms and 10000 Angstroms.

Figure 6:
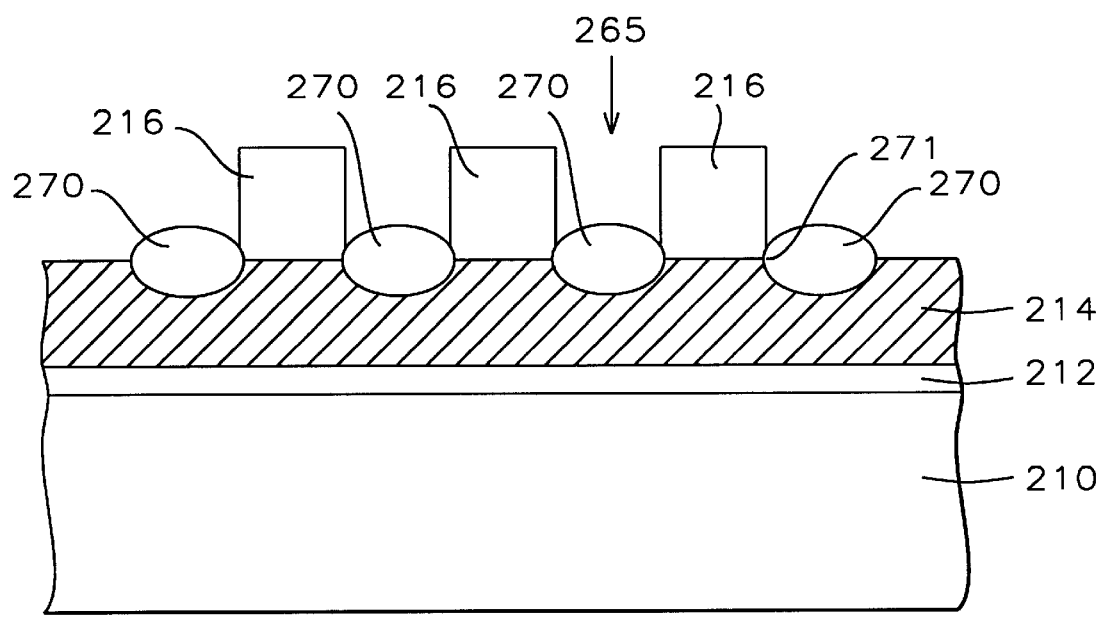

Referring to FIG. 6, the first dielectric layer (216) is etched through the square openings where the openings (not shown) in the second photosensitive mask (not shown) and the openings (235) in the Second dielectric layer (218) intersect; thereby forming square openings (255) in the first dielectric layer (216). The first dielectric layer (216) can be etched using a process known in the art, such as a reactive ion etch process with a $CHF_3/O_2$, $CH_2F_2$, or $CH_3F$ chemistry. After the first dielectric layer (216) is etched, the second photosensitive mask (not shown) is removed using an ashing process in oxygen as is known in the art. Then, the remaining portions of the Second dielectric layer (218) are removed. The remaining portions of the Second dielectric layer (218) are preferably removed using a buffered oxide etch as is known in the art.

Still referring to FIG. 6, square ploy oxide regions (270) are thermally grown through the square openings (255) in the first dielectric layer (216) at a temperature of between about 800° C. and 900° C. The square poly oxide regions (270) have a bird beak (tapered portion) (271) which extends under the first dielectric layer (216).

Figure 7:
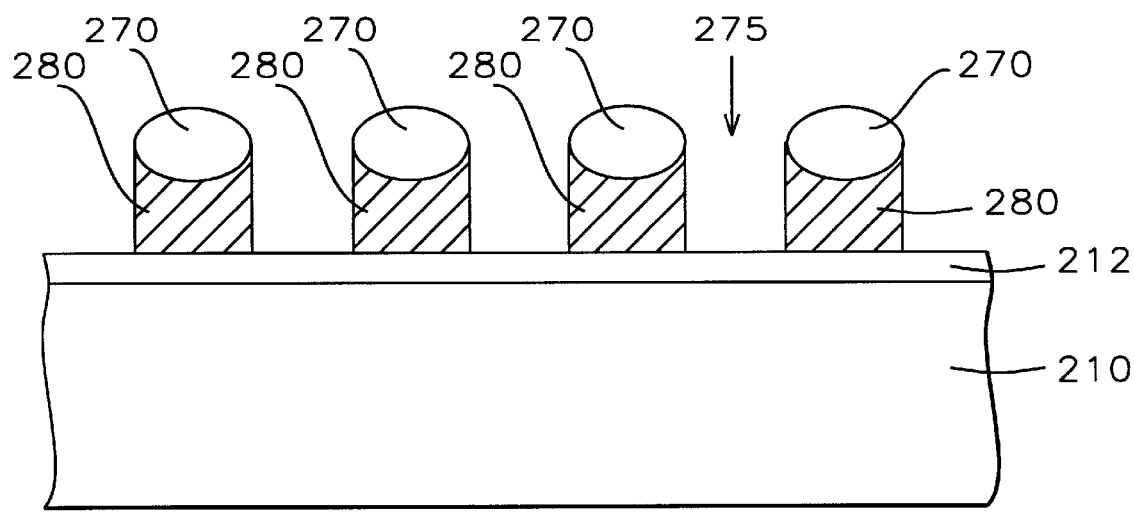

Referring to FIG. 7, the remaining portions of the first dielectric layer (216) are removed using an etch selective to silicon nitride over poly oxide, such as wet etching using $H_3PO_4$ at a temperature of about 165° C.

The polysilicon layer (214) is anisotropically etched selectively to polysilicon over polyoxide, using the square poly oxide regions (270) as a hard mask for the etch, thereby forming floating gates (280) where the polysilicon layer (214) underlies the square poly oxide regions (270). The polysilicon layer (214) can be etched by a process known in the art, such as a reactive ion etch process using a $Cl_2$ and HBr chemistry. The poly oxide regions (270) form a hard mask having openings (275) which are smaller than the openings which can be formed in a photosensitive mask. This is because the bird's beaks (271) serve to reduce the dimensions of these openings (270).

While the invention has been particularly shown and described with reference to the preferred embodiments thereof, it will be understood by those skilled in the art that various changes in form and details may be made without departing from the spirit and scope of the invention.

What is claimed is:

1. A method for forming a square oxide structure without a rounding effect at its corners comprising the steps of:
   a. providing a semiconductor structure having a pad layer thereon;
   b. forming a first dielectric layer on said pad layer and forming a Second dielectric layer on said first dielectric layer; said second dielectric layer being composed of a different material than said first dielectric layer;
   c. patterning said Second dielectric layer to form openings in said Second dielectric layer in a first direction;
   d. forming a second photosensitive mask over said Second dielectric layer and said first dielectric layer; said second photosensitive mask having a plurality of parallel openings in a second direction perpendicular to said first direction; thereby forming square openings where said openings in said second photosensitive mask intersect said openings in said Second dielectric layer;
   e. etching said first dielectric layer through said square openings where said openings in said second photosensitive mask and said openings in said Second dielectric layer intersect; thereby forming square openings in said first dielectric layer;
   f. removing said second photosensitive mask;
   g. removing said Second dielectric layer; whereby exposed portions of said pad layer are also removed;
   h. etching a trench in said semiconductor structure through said square openings in said first dielectric layer; and
   i. forming an STI oxide layer over said semiconductor structure and said first dielectric layer and etching said STI oxide layer back to form square oxide areas without a rounding effect at its corners.

2. The method of claim 1 wherein said second photosensitive mask has a thickness of between about 7000 Angstroms and 10000 Angstroms.

3. The method of claim 1 wherein said first dielectric layer is composed of silicon nitride and has a thickness of between about 1500 Angstroms and 2000 Angstroms.

4. The method of claim 2 wherein said first dielectric layer is composed of silicon nitride and has a thickness of between about 1500 Angstroms and 2000 Angstroms.

5. The method of claim 1 wherein said second dielectric layer is composed of silicon dioxide and has a thickness of between about 1500 Angstroms and 2000 Angstroms.

6. The method of claim 4 wherein said second dielectric layer is composed of silicon dioxide has a thickness of between about 1500 Angstroms and 2000 Angstroms.

7. The method of claim 1 wherein said Second dielectric layer is patterned by forming a first photosensitive mask over said Second dilectric layer having a plurality of parallel openings in said first direction, and etching said Second dielectric layer through said openings.

8. A method for forming a square floating gate in a split-gate cell without a rounding effect at its corners, comprising the steps of:

a. providing a semiconductor structure having a pad layer on said semiconductor structure, and a polysilicon layer on said pad layer;

b. forming a first dielectric layer on said polysilicon layer;

c. forming a Second dielectric layer on said first dielectric layer;

d. patterning said Second dielectric layer; thereby forming a plurality of parallel openings in said Second dielectric layer in a first direction;

e. forming a second photosensitive mask over said Second dielectric layer and said first dielectric layer; said second photosensitive mask having a plurality of parallel openings in a second direction perpendicular to said first direction; whereby said openings in said second photosensitive mask and said openings in said Second dielectric layer form square openings at their intersection;

f. etching said first dielectric layer through said openings in said second photosensitive mask and said openings in said Second dielectric layer; thereby forming square openings in said first dielectric layer;

g. removing said second photosensitive mask;

h. removing said Second dielectric layer;

i. growing polysilicon oxide structures in said square openings in said first dielectric layer, thereby forming a plurality of square polysilicon oxide hard masks having a pattern of openings therebetween; and j. etching said polysilicon layer through said pattern of openings between said polysilicon oxide hard masks; thereby forming square floating gate polysilicon regions under said polysilicon oxide hard masks.

9. The method of claim 8 wherein said second photosensitive mask has a thickness of between about 7000 Angstroms and 10000 Angstroms.

10. The method of claim 8 wherein said first dielectric layer is composed of silicon nitride and has a thickness of between about 1500 Angstroms and 2000 Angstroms.

11. The method of claim 9 wherein said first dielectric layer is composed of silicon nitride and has a thickness of between about 1500 Angstroms and 2000 Angstroms.

12. The method of claim 8 wherein said Second dielectric layer is composed of silicon dioxide and has a thickness of between about 1500 Angstroms and 2000 Angstroms.

13. The method of claim 9 wherein said Second dielectric layer is composed of silicon dioxide and has a thickness of between about 1500 Angstroms and 2000 Angstroms.

14. The method of claim 8 wherein said Second dielectric layer is patterned by forming a first photosensitive mask over said Second dielectric layer having a plurality of parallel openings in said first direction, and etching said Second dielectric layer through said openings.

* * * * *